United States Patent [19]

Kitagawa

[11] Patent Number: 5,391,392

[45] Date of Patent: Feb. 21, 1995

[54] METHOD FOR MANUFACTURING ELECTRICAL COMPONENTS

[75] Inventor: Hiroji Kitagawa, Nagoya, Japan

[73] Assignee: Kitagawa Industries Co., Ltd., Japan

[21] Appl. No.: 160,443

[22] Filed: Dec. 1, 1993

Related U.S. Application Data

[63] Continuation of Ser. No. 868,003, Apr. 14, 1992, abandoned.

[30] Foreign Application Priority Data

Aug. 19, 1991 [JP] Japan .................. 3-206949

[51] Int. Cl.⁶ .................................. B05D 5/12
[52] U.S. Cl. .............................. 427/81; 427/123; 427/275; 427/290; 427/309; 427/355; 427/383.1; 427/443.2
[58] Field of Search ............. 427/81, 123, 275, 290, 427/309, 355, 443.2, 383.1

[56] References Cited

U.S. PATENT DOCUMENTS

| | | | |
|---|---|---|---|
| 2,961,351 | 11/1960 | Ludwig | 117/203 |
| 4,684,438 | 8/1987 | Lazzari | 649/156 |
| 4,752,999 | 6/1988 | Sills, Jr. | 605/29 |

FOREIGN PATENT DOCUMENTS

| | | |
|---|---|---|
| 570877 | 7/1945 | United Kingdom. |
| 878205 | 9/1961 | United Kingdom. |
| 884964 | 12/1961 | United Kingdom. |
| 1321439 | 6/1973 | United Kingdom. |
| 1481904 | 8/1977 | United Kingdom. |
| 2069240 | 2/1980 | United Kingdom. |
| 2124037 | 7/1982 | United Kingdom. |
| 2189936 | 11/1987 | United Kingdom. |

Primary Examiner—Bernard Pianalto
Attorney, Agent, or Firm—Davis, Bujold & Streck

[57] ABSTRACT

A highly reliable electrical component, a plurality of such electrical components, and a method for manufacturing the electrical component and the plurality thereof with high productivity are provided. The plurality involves a dielectric substrate including multiple separable chips. Each of the chips is provided with two parallel winding grooves, into which pasted copper is filled under a reduced pressure, dried and solidified to form electrical conductors. By connecting pins to ends of the electrical conductors, capacitors or noise filters are obtained. The plurality is manufactured, tested, packaged and transported, before being divided into separate chips for use.

8 Claims, 6 Drawing Sheets

METHOD FOR MANUFACTURING ELECTRICAL COMPONENTS

This is a continuation of application Ser. No. 07/868,003, filed on Apr. 14, 1992, abandoned.

BACKGROUND OF THE INVENTION

This invention relates to a capacitor, a noise filter or other electrical component, a plurality of such electrical components, and a method for manufacturing the electrical component and the plurality thereof.

A known capacitor is formed by winding two dielectric sheets alternating with two electrically conductive foils into a tubular form, and connecting lead wires to edges or terminating ends of the electrically conductive foils.

When the lead wires are connected to both the edge and terminating end of the first electrically conductive foil, an inductance component possessed by the first electrically conductive foil and a capacitance component formed between the first and second electrically conductive foils form a known noise filter, which provides an attenuation covering a wide frequency band.

A conventional unit for manufacturing the known capacitors or noise filters comprises two reels for supplying the dielectric sheets, two other reels for supplying aluminum foils as the electrically conductive foils, and a take-up shaft for winding the dielectric sheets and the aluminum foils. The unit further includes multiple guide rollers or other means for guiding the dielectric sheets and the aluminum foils from the respective reels to the take-up shaft. In the unit, the two dielectric sheets and the two aluminum foils are delivered from the respective reels at a constant tension and are wound onto the take-up shaft, such that these sheets and foils overlap alternately.

The conventional unit is expensive, the dielectric sheets or the aluminum foils are difficult to wind uniformly tight, and a number of defective capacitors or noise filters result. Therefore, the manufacturing of the capacitors or the noise filters incurs high cost and low productivity.

SUMMARY OF THE INVENTION

Wherefore, an object of this invention is to provide a highly reliable capacitor, noise filter or other electrical component, a plurality of such components, and a method for manufacturing the component and pluralities thereof with high productivity.

According to the invention there is provided an electrical component comprising a dielectric substrate provided with two parallel winding grooves with electrical conductors in the grooves.

According to the invention there is also provided a plurality of electrical components comprising a dielectric substrate consisting of a plurality of chips, each of the chips including two parallel winding grooves with electrical conductors in the grooves.

According to the invention there is also provided a method for manufacturing an electrical component comprising the steps of forming two parallel winding grooves in a dielectric substrate, placing the dielectric substrate into a low-pressure (sub-atmospheric) environment formed in a container containing a pasted electrically conductive material to fill the grooves with the pasted electrically conductive material, and polishing a surface of the dielectric substrate to remove excessive pasted electrically conductive material from the surface of the dielectric substrate, leaving the pasted electrically conductive material in the grooves.

The electrical component has such a simple structure as aforementioned. By connecting lead wires to the parallel electrical conductors, a capacitor is obtained. On the other hand, when the lead wires are connected to both a winding edge and terminating end of the first electrical conductor and to a winding edge or terminating end of the second electrical conductor, an inductance component possessed by the first electrical conductor and a capacitance component formed between the first and second electrical conductors form a three-terminal noise filter. This noise filter has an effectively attenuating characteristics covering a wide frequency band. By connecting the lead wires also to both the winding edge and terminating end of the second electrical conductor, a four-terminal noise filter can be obtained.

The use of multiple capacitor or noise filter chips increases production efficiency. Further, by testing the chips of the combination for their electrical properties at the same time, testing time can be saved and testing efficiency can be improved. By packaging and transporting the dielectric substrate loaded with undivided chips, packaging and transporting steps are facilitated.

The manufacturing method can comprise fully automated steps, in which highly reliable capacitors or noise filters are manufactured in a short time period of time in large quantities with high production efficiency.

BRIEF DESCRIPTION OF THE DRAWINGS

The invention will now be described, by way of example, with reference to the accompanying drawings, in which.

DETAILED DESCRIPTION OF THE PREFERRED EMBODIMENT

Figure 1:
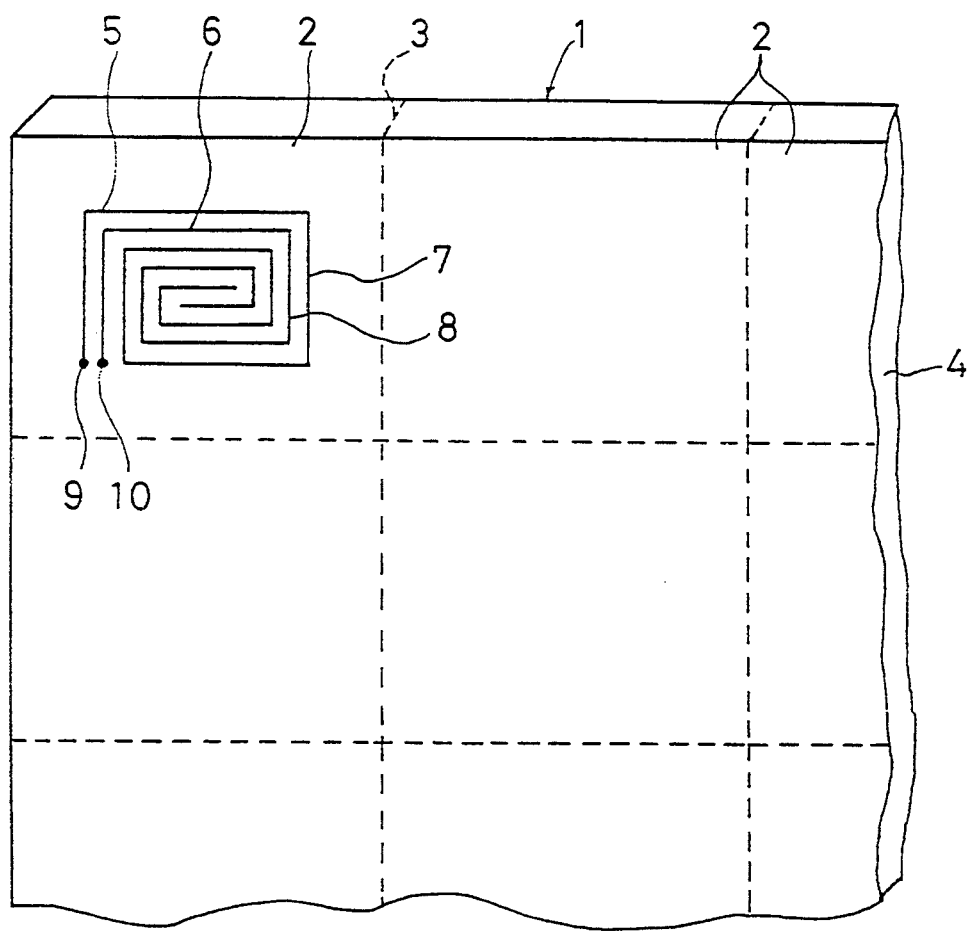
FIG. 1 is a perspective view of a capacitor, on a multi-chip dielectric substrate, of a first embodiment according to this invention.
Figure 2A:
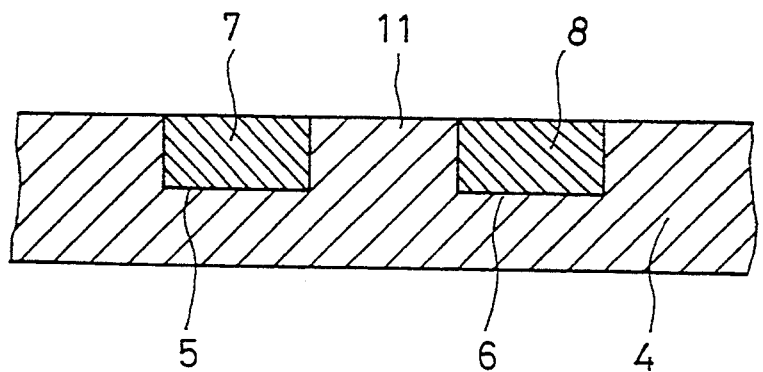
FIGS. 2A and 2B are cross-sectional views showing grooves formed in the dielectric substrate.
Figure 2B:
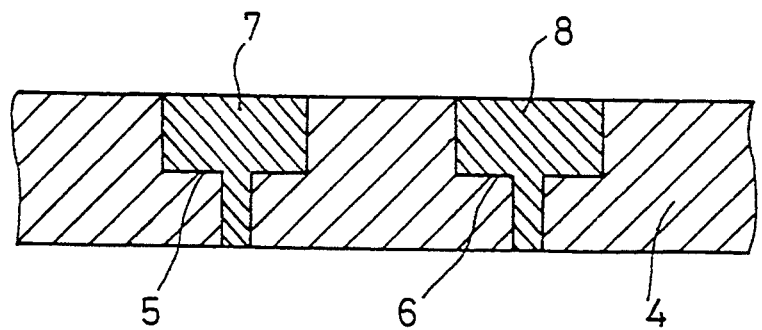

As shown in FIG. 1, a multi-capacitor structure 1 comprises a dielectric substrate 4 of polyester, including multiple capacitor chips 2 separable at perforations 3. As shown in FIGS. 1 and 2A, on one face of the dielectric substrate 4, each of the capacitor chips 2 is provided with two parallel winding grooves 5 and 6, in which electrical conductors 7 and 8 of copper or other conductive material are formed, respectively. In the modification to the grooves 5 and 6, the grooves 5 and 6 extend through the thickness of the dielectric substrate 4 as shown in FIG. 2B, so that pasted copper, when used as the conductive material, can quickly enter the grooves 5 and 6. The grooves 5 and 6 may extend through the dielectric substrate 4 either over part or all of their length. The ends of the electrical conductors 7 and 8 are connected to pins 9 and 10, respectively. The electrical conductors 7 and 8 formed in the grooves 5 and 6, are separated by a wall 11. As a result, a coupling of capacitance C exists between the electrical conductors 7 and 8. Therefore, by forming the dielectric substrate 4 of a material having a high dielectric constant, the value of the capacitance C can be set as large as required.

A method for manufacturing the multi-capacitor structure 1 shown in FIG. 1 will now be explained, referring to FIGS. 3A, 3B, 3C, 3D and 3E.

Figure 3A:
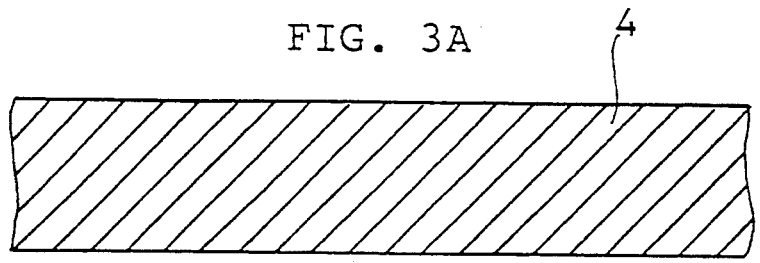
FIGS. 3A, 3B, 3C, 3D and 3E are cross-sectional view showing manufacturing steps of a method of making the capacitor of FIG. 1.
Figure 3B:
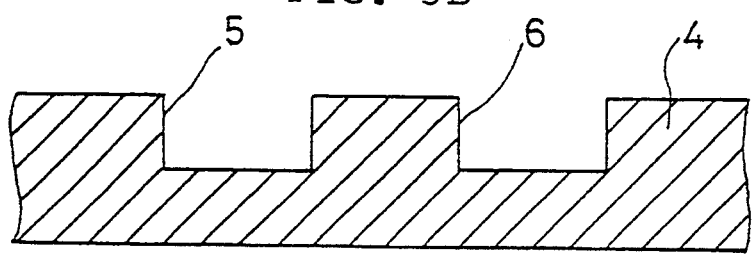

As shown in FIG. 3B, the grooves 5 and 6 are formed in each of the capacitor chips 2 of the dielectric substrate 4 shown in FIG. 3A. The grooves 5 and 6 can be formed by cutting the dielectric substrate 4, by exposing and developing the corresponding patterns through photoengraving process steps, or by injecting synthetic resin in molds having the corresponding patterns.

Figure 3C:
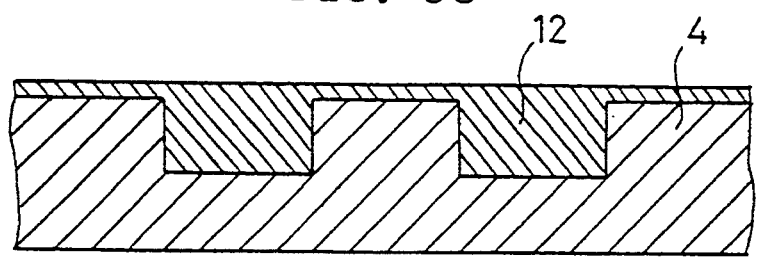

Subsequently, the dielectric substrate 4 with the grooves 5 and 6 formed therein is placed into a low-pressure (sub-atmospheric) environment formed in a container of pasted copper. As shown in FIG. 3C, the grooves 5 and 6 are thereby filled with pasted copper 12. After the dielectric substrate 4 is taken out of the low-pressure container, the pasted copper 12 is attached also onto the surface of the dielectric substrate 4. Subsequently, by drying and solidifying the pasted copper 12, the electrical conductors 7 and 8 are formed in the grooves 5 and 6, respectively.

Figure 3D:
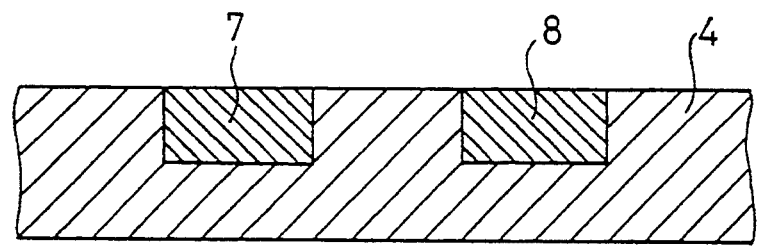

By polishing the surface of the dielectric substrate 4 with an automatic polishing machine or other suitable means, excessive solid copper paste is removed from the surface of the dielectric substrate 4 as shown in FIG. 3D.

Figure 3E:
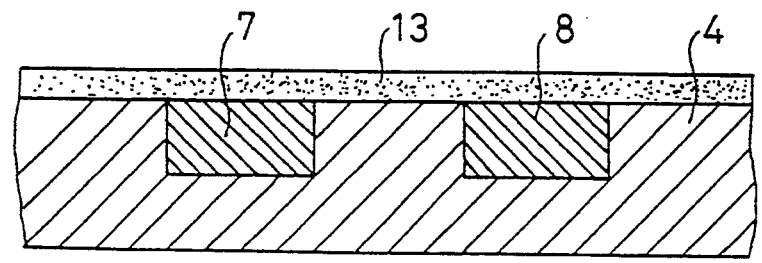

Subsequently, as shown in FIG. 3E, an insulating top coat 13 is formed over the dielectric substrate 4 including the electrical conductors 7 and 8. Lastly, holes are made in the portions corresponding to the electrical conductors 7 and 8 of the insulating top coat 13, and the pins 9 and 10 are inserted in the holes.

Figure 4:
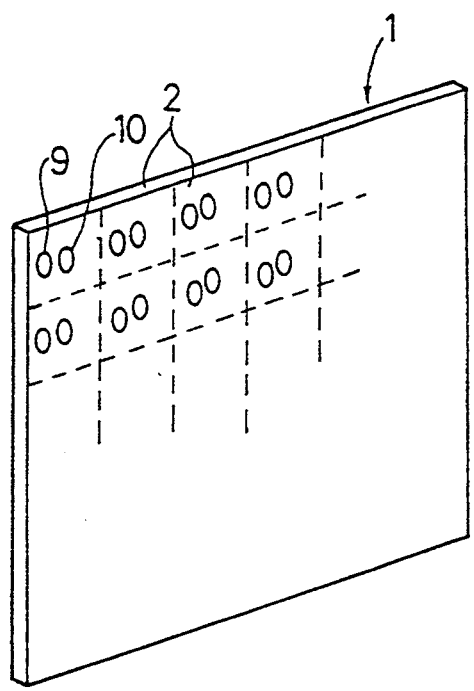
FIG. 4 is an explanatory view showing the multi-chip configuration of dielectric substrate of this invention.

Post-manufacturing steps will now be explained. As shown in FIG. 4, the multi-capacitor structure 1 manufactured through the steps shown in FIGS. 3A through 3E is tested for electrical properties. Since the pins 9 and 10 project from the surface of the multi-capacitor structure 1 at vertically and horizontally equal intervals, a testing unit preferably has pins positioned in a manner corresponding to the pins 9 and 10 of the multi-capacitor structure 1 to which the testing unit is used. Such a testing unit allows all the capacitor chips 2 of the multi-capacitor structure 1 to be tested at the same time.

After the test is completed, the multi-capacitor structure 1 loaded with the connected capacitor chips 2 is packaged for transport.

In use, the multi-capacitor structure 1 is divided at the perforations 3 into the individual capacitor chips 2.

As aforementioned, each of the capacitor chips 2 comprises the dielectric substrate 4 including the two parallel winding grooves 5 and 6 with the electrical conductors 7 and 8 filled therein under a reduced pressure. The multi-capacitor structure 1 thus has a simple structure.

In a mass production of the capacitor chips 2 production efficiency can be enhanced. For example, 3,200 capacitor chips 2 of 5 mm by 10 mm can be obtained from the single dielectric substrate 4 of 40 cm by 40 cm. Further, the manufacturing steps of the capacitor chips 2 can be automated and highly reliable capacitor chips 2 can therefore be manufactured in large quantities with high production efficiency. Also, the capacitor chips 2 can be tested in a batch for their electrical properties, thus greatly reducing the time required for the test, and the capacitor chips 2 can be packaged for transport without being divided, thus facilitating the packaging step.

Figure 5:
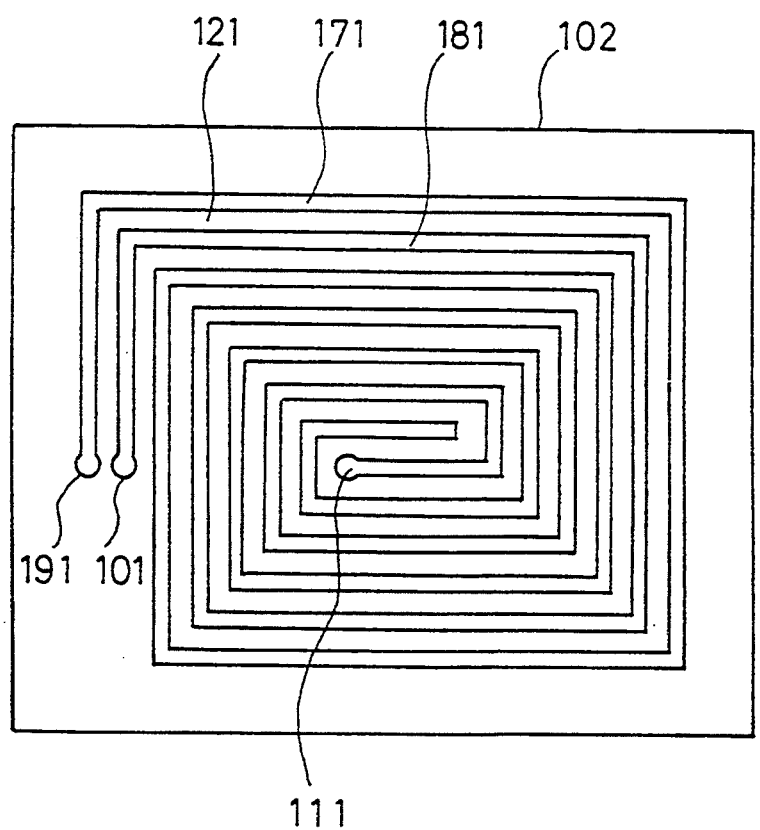
FIG. 5 is an explanatory view showing a three-terminal noise filter of this invention.

In the embodiment shown in FIG. 5, a chip 102 having a function of a three-terminal noise filter is obtained by connecting a pin 191 to one end of a first electrical conductor 171 and connecting pins 101 and 111 to both ends of a second electrical conductor 181. As shown by the equivalent circuit of the three-terminal noise filter in FIG. 6, the pins 101 and 111 are equivalent to input terminals, and the pin 191 is equivalent to a grounding terminal. The second electrical conductor 181 connected to the input terminals is equivalent to an inductor L1 and the first electrical conductor 171 connected to the grounding terminal is equivalent to an inductor L2. Since the first and second electrical conductors 171 and 181 are separated from each other by a wall 121, a capacitance C is permitted between the first and second electrical conductors 171 and 181. As a result, the chip 102 functions as an inductance-capacitance noise filter having three terminals. The chips 102 can be four-terminal noise filters by connecting a pin to the other end of the first electrical conductor 171.

Figure 6:
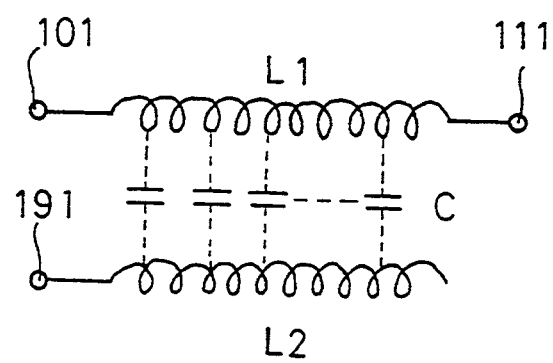
FIG. 6 illustrates an equivalent circuit of the three-terminal noise filter shown in FIG. 5.

A plurality of the chips 102 of the embodiment of FIG. 6 and the four-terminal variation are manufactured, tested, transported and operated in the same way as the capacitor aggregation 1. Therefore, this embodiment is highly reliable noise filters and can be manufactured with high productivity.

This invention has been described above with reference to preferred embodiments as shown in the drawings. Modifications and alterations may become apparent to one skilled in the art upon reading and understanding the specification. Despite the use of embodiments for illustration purposes, however, it is intended to include all such modifications and alterations within the scope and spirit of the appended claims.

What is claimed is:

1. A method of manufacturing an electrical component, simultaneously manufactured with a plurality of other electrical components, from a thin planar dielectric substrate, comprising the steps of:

dividing a first surface of a dielectric substrate with a plurality of first perforations and a plurality of second perforations with the plurality of first perforations intersecting the plurality of second perforations to thereby form a plurality of grid divisions;

forming a plurality of parallel spaced winding grooves in said dielectric substrate with one pair of parallel spaced winding grooves being formed in each said grid division;

placing the dielectric substrate into a container containing an electrically conductive material in paste form, reducing the internal pressure of said container to below atmospheric pressure, allowing said electrically conductive material in paste form to fill said plurality of parallel spaced winding grooves while the internal pressure of said container remains below atmospheric pressure, and allowing the internal pressure of said container to rise to atmospheric pressure;

removing excessive electrically conductive material from a surface of the dielectric substrate carrying said plurality of parallel spaced winding grooves, leaving sufficient electrically conductive material in said plurality of parallel spaced winding grooves, together with drying the electrically conductive material to form separate parallel electrical conductors in each of said plurality of parallel spaced winding grooves whereby a capacitance, between each said pair of parallel spaced winding grooves, is permitted via said dielectric material located between said parallel winding grooves; and dividing the dielectric substrate, along said plurality of first and second perforations, into a plurality of separate electrical components each being formed of a single grid division with each divided electrical component having a pair of parallel electrical conductors.

2. A method according to claim 1 further comprising the step of carrying out simultaneously the steps on each of a plurality of separable chips forming the dielectric substrate.

3. A method according to claim 1 further comprising the step of forming an insulating coating over the electrical conductors formed in said winding grooves.

4. A method according to claim 1 further comprising the step of forming holes at desired locations in the electrical component.

5. A method according to claim 1 further comprising the step of forming said parallel spaced winding grooves so that said winding grooves extend completely through the first surface of said dielectric substrate to an opposed second surface.

6. A method according to claim 1 further comprising the step of connecting a terminal pin to at least one end of each formed pair of parallel electrical conductors.

7. A method of simultaneously manufacturing a plurality of capacitors comprising the steps of:

(1) forming a plurality of grid divisions in a first surface of a thin planar dielectric substrate via by a plurality of perforations intersecting one another and forming a pair of parallel winding grooves in each formed grid division;

(2) placing said dielectric substrate into a container containing an electrically conductive material in paste form, reducing the internal pressure of said container to below atmospheric pressure, allowing said electrically conductive material in paste form to fill said pair of parallel winding grooves in each of said grid divisions, while the internal pressure of said container remains below atmospheric pressure, and allowing the internal pressure of said container to rise to atmospheric pressure;

(3) removing excessive electrically conductive material from the surface of said dielectric substrate carrying said pair of parallel winding grooves formed in each of said grid divisions, leaving sufficient electrically conductive material in said pair of parallel winding grooves in each said grid division, together with drying the electrically conductive material to form a pair of separate parallel winding electrical conductors in said pair of parallel winding grooves;

(4) connecting, in each said grid division, a pin to at least one end of each of said formed electrical conductors; and (5) dividing said dielectric substrate along said perforations to form a plurality of capacitor chips with each said formed capacitor chip permitting a capacitance between the pair of electrical conductors, contained on each said capacitor chip, via the dielectric material located between the pair of electrical conductors.

8. A method of simultaneously manufacturing a plurality of three-terminal noise filters comprising the steps of:

(1) forming a plurality of grid divisions in a first surface of a thin plate dielectric substrate via by a plurality of perforations intersecting one another and forming a pair of parallel winding grooves in each formed grid division;

(2) placing said dielectric substrate into a container containing an electrically conductive material in paste form, reducing the internal pressure of said container to below atmospheric pressure, allowing said electrically conductive material in paste form to fill said pair of parallel winding grooves in each of said grid divisions while the internal pressure of said container remains below atmospheric pressure, and allowing the internal pressure of said container to rise to atmospheric pressure;

(3) removing excessive electrically conductive material from the surface of the dielectric substrate carrying said pair of parallel winding grooves in each of said grid divisions, while leaving sufficient electrically conductive material in said pair of parallel winding grooves in each said grid division, together with drying the electrically conductive material to form a pair of separate electrical conductors in said pair of parallel winding grooves;

(4) connecting, in each said grid division, first and second pins to both opposed ends of one of the electrical conductors of said pair of separate parallel winding conductors and connecting a third pin to one end of the other separate electrical conductor of that pair; and (5) dividing said dielectric substrate along said perforations to form a plurality of noise filter chips with each of said noise filter chip having said first and second pins as input terminals and said third pin as a grounding terminal, and one of the electrical conductors functioning as a first inductor while the other electrical conductor functioning as a second inductor, and a capacitance being generatable between said pair of separated parallel conductors via said dielectric material located between said electrical conductors.

* * * * *